(12) United States Patent
Marcacci (10) Patent No.: US 10,510,564 B2
(45) Date of Patent: Dec. 17, 2019

(54) DYNAMIC COOLANT MIXING MANIFOLD

(71) Applicant: LAM RESEARCH CORPORATION, Fremont, CA (US)

(72) Inventor: Alexander Charles Marcacci, Mountain View, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 11 days.

(21) Appl. No.: 15/867,205

(22) Filed: Jan. 10, 2018

(65) Prior Publication Data
US 2019/0214279 A1    Jul. 11, 2019

(51) Int. Cl.
*H01L 21/67* (2006.01)
*F28F 27/02* (2006.01)

(52) U.S. Cl.
CPC ........ *H01L 21/67103* (2013.01); *F28F 27/02* (2013.01); *H01L 21/67109* (2013.01); *H01L 21/67248* (2013.01)

(58) Field of Classification Search
CPC .......... H01L 21/67103; H01L 21/67248; F28F 27/02
USPC ....................................................... 165/295
See application file for complete search history.

(56) References Cited

U.S. PATENT DOCUMENTS

| | | | | |
|---|---|---|---|---|
| 4,607,220 A * | 8/1986 | Hollman | ............ | G01R 31/2875 324/750.14 |
| 7,832,222 B2 * | 11/2010 | McMasters | ........ | B60H 1/00585 62/114 |
| 8,600,543 B2 * | 12/2013 | Takechi | ............ | H01L 21/67005 700/121 |
| 2003/0045104 A1 * | 3/2003 | Fujishima | ......... | H01L 21/67248 438/689 |
| 2003/0197852 A1 * | 10/2003 | Johnson | ............... | G01N 1/2202 356/37 |
| 2009/0001032 A1 * | 1/2009 | Davison | .............. | B29C 45/0001 211/41.18 |
| 2009/0118872 A1 * | 5/2009 | Nonaka | .............. | G05D 23/1934 700/285 |
| 2009/0229641 A1 * | 9/2009 | Yoshida | .................... | B08B 3/00 134/107 |
| 2011/0284505 A1 * | 11/2011 | Ricci | .................. | H01J 37/32715 219/121.54 |
| 2015/0107268 A1 * | 4/2015 | Han | ........................ | F25B 21/02 62/3.3 |
| 2015/0176928 A1 * | 6/2015 | Tabuchi | ............. | G05D 23/1393 165/96 |

(Continued)

*Primary Examiner* — Paul Alvare (57) ABSTRACT

A system for controlling temperature of a substrate, which is arranged on a substrate support assembly, includes first and second sources to respectively supply a fluid at first and second temperatures at a fixed flow rate. First and second three-way proportional valves receive the fluid from the first and second sources, mix first portions of the received fluid to supply the fluid having a predetermined temperature to the substrate support assembly at a predetermined flow rate, and return second portions of the received fluid to the first and second sources. A third three-way proportional valve receives the fluid from the substrate support assembly and returns the received fluid to the first and second sources. A controller controls the first and second valves to supply the fluid to the substrate support assembly and controls the third valve to divide the fluid between the first and second sources.

13 Claims, 2 Drawing Sheets

(56) References Cited

U.S. PATENT DOCUMENTS

2017/0092471 A1* 3/2017 Wakai ............... H01L 21/67109
2017/0301516 A1* 10/2017 Bhutta .............. H01J 37/32935
2018/0269090 A1* 9/2018 Kobayashi ........ H01L 21/67248

* cited by examiner

DYNAMIC COOLANT MIXING MANIFOLD

FIELD

The present disclosure relates generally to semiconductor manufacturing equipment and more particularly to controlling temperature of a substrate in processing chambers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A temperature of a substrate (e.g., a semiconductor wafer) in a processing chamber can be controlled in many ways. For example, one or more heaters can be arranged in a substrate support assembly, and the power supplied to the heaters can be controlled to control the temperature of the substrate. As another example, one or more fluids can be circulated through one or more flow passages arranged in the substrate support assembly using valves, and the temperature of the fluids can be used to control the temperature of the substrate.

SUMMARY

A system for controlling temperature of a substrate arranged on a substrate support assembly comprises first and second sources to respectively supply a fluid at first and second temperatures. The system further comprises a first three-way proportional valve with an input port connected to the first source, a first output port connected to a supply line to supply the fluid from the first source to the substrate support assembly, and a second output port connected to the first source. The system further comprises a second three-way proportional valve with an input port connected to the second source, a first output port connected to the supply line to supply the fluid from the second source to the substrate support assembly, and a second output port connected to the second source. The system further comprises a third three-way proportional valve with an input port connected to a return line to receive the fluid from the substrate support assembly, and first and second output ports respectively connected to the first and second sources to return the fluid received from the substrate support assembly to the first and second sources. The system further comprises a controller to control the first and second three-way proportional valves to output first portions of the fluid received from the first and second sources via the respective input ports to supply the fluid to the substrate support assembly via the supply line at a predetermined temperature and at a predetermined flow rate, and to return second portions of the fluid received from the first and second sources via the respective input ports to the first and second sources via the second output ports of the first and second three-way proportional valves, respectively; and to control the third three-way proportional valve to divide the fluid received from the substrate support assembly via the return line between the first and second sources.

In other features, the controller controls a temperature of the substrate based on the fluid supplied to the substrate support assembly via the supply line at the predetermined temperature and at the predetermined flow rate.

In other features, the first and second sources supply the fluid to the first and second three-way proportional valves at a fixed flow rate.

In other features, the system further comprises a temperature sensor associated with the supply line and a flow meter associated with the return line. The controller controls the first and second three-way proportional valves based on data received from the temperature sensor and the flow meter.

In other features, the controller controls the third three-way proportional valve based on an indication of weight of the fluid in each of the first and second sources.

In other features, the third three-way proportional valve divides the fluid received from the substrate support assembly between the first and second sources to maintain fluid levels of the first and second sources between first and second thresholds.

In other features, the system further comprises an enclosure to enclose the first, second, and third three-way proportional valves, and fluid lines connecting the first and second sources to the first, second, and third three-way proportional valves. The enclosure comprises an inlet and an outlet, and nitrogen is passed through the enclosure via the inlet and the outlet to displace humid air from the enclosure.

In still other features, a system for controlling temperature of a substrate arranged on a substrate support assembly comprises first and second sources to respectively supply a fluid at first and second temperatures at a fixed flow rate. The system further comprises first and second three-way proportional valves to receive the fluid from the first and second sources at the first and second temperatures at the fixed flow rate, to mix first portions of the received fluid to supply the fluid having a predetermined temperature to the substrate support assembly at a predetermined flow rate, and to return second portions of the received fluid to the first and second sources. The system further comprises a third three-way proportional valve to receive the fluid from the substrate support assembly at the predetermined flow rate and to return the fluid received from the substrate support assembly to the first and second sources. The system further comprises a controller to control the first and second three-way proportional valves to supply the fluid having the predetermined temperature to the substrate support assembly at the predetermined flow rate, and to control the third three-way proportional valve to divide the fluid received from the substrate support assembly between the first and second sources.

In other features, the controller controls a temperature of the substrate based on the fluid supplied to the substrate support assembly at the predetermined temperature and at the predetermined flow rate.

In other features, the system further comprises a temperature sensor associated with a supply line that supplies the fluid from the first and second three-way proportional valves to the substrate support assembly. The system further comprises a flow meter associated with a return line that returns the fluid from the substrate support assembly to the third three-way proportional valve. The controller controls the first and second three-way proportional valves based on data received from the temperature sensor and the flow meter.

In other features, the controller controls the third three-way proportional valve based on an indication of weight of the fluid in each of the first and second sources.

In other features, the third three-way proportional valve divides the fluid received from the substrate support assembly between the first and second sources to maintain fluid levels of the first and second sources between first and second thresholds.

In other features, the system further comprises an enclosure to enclose the first, second, and third three-way proportional valves, and fluid lines connecting the first and second sources to the first, second, and third three-way proportional valves. The enclosure comprises an inlet and an outlet, and nitrogen is passed through the enclosure via the inlet and the outlet to displace humid air from the enclosure.

In still other features, a method for controlling temperature of a substrate arranged on a substrate support assembly comprises receiving, at first and second three-way proportional valves, a fluid having first and second temperatures at a fixed flow rate from first and second sources, respectively. The method further comprises mixing, using the first and second three-way proportional valves, portions of the fluid received from the first and second sources, the mixed portions of the fluid having a predetermined temperature. The method further comprises returning, using the first and second three-way proportional valves, unused portions of the fluid received from the first and second sources to the first and second sources, respectively. The method further comprises supplying the mixed portions of the fluid having the predetermined temperature to the substrate support assembly at a predetermined flow rate. The method further comprises receiving the mixed portions of the fluid from the substrate support assembly at a third three-way proportional valve. The method further comprises returning, using the third three-way proportional valve, the mixed portions of the fluid received from the substrate support assembly to the first and second sources. The method further comprises controlling the first and second three-way proportional valves to supply the mixed portions of the fluid having the predetermined temperature to the substrate support assembly at the predetermined flow rate. The method further comprises controlling the third three-way proportional valve to divide the mixed portions of the fluid received from the substrate support assembly between the first and second sources.

In other features, the method further comprises controlling a temperature of the substrate based on the fluid supplied to the substrate support assembly at the predetermined temperature and at the predetermined flow rate.

In other features, the method further comprises sensing a temperature of the mixed portions of the fluid being supplied from the first and second three-way proportional valves to the substrate support assembly. The method further comprises measuring a flow rate of the mixed portions of the fluid flowing from the substrate support assembly to the third three-way proportional valve. The method further comprises controlling the first and second three-way proportional valves based on the temperature and the flow rate.

In other features, the method further comprises controlling the third three-way proportional valve based on an indication of weight of the fluid in each of the first and second sources.

In other features, the method further comprises dividing the mixed portions of the fluid received from the substrate support assembly between the first and second sources to maintain fluid levels of the first and second sources between first and second thresholds.

In other features, the method further comprises enclosing, in an enclosure, the first, second, and third three-way proportional valves, and fluid lines connecting the first and second sources to the first, second, and third three-way proportional valves. The method further comprises passing nitrogen through the enclosure to displace humid air from the enclosure.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure proposes systems and methods for controlling a temperature of a substrate arranged on a substrate support assembly in a processing chamber. Specifically, the systems and methods eliminate the multiplicity of two-way valves used in the prior art by using three three-way proportional valves. The three three-way proportional valves allow controlled mixing of hot and cold coolant, allow coolant sources to supply the hot and cold coolants at a constant flow rate, and divide the flow of coolant returned from the substrate support assembly to each coolant source. The system and method can supply the coolant to the substrate support assembly at a desired temperature and at a desired flow rate, which simplifies the temperature control of the substrate as compared to the prior art.

In addition, the system and method according to the present disclosure provide many advantages over the prior art. Since the coolant sources supply the hot and cold coolant to the valves at a constant flow rate, the design of the coolant sources (e.g., pump control and temperature control) is simplified. Further, since the flow of the coolant returned from the substrate support assembly is divided between the coolant sources, under- and overfilled conditions do not occur in the coolant sources. Additionally, nitrogen is passed through an enclosure enclosing the valves and fluid lines connecting the valves to the coolant sources to displace humid air from the enclosure. This increases the temperature range over which the substrate temperature can be controlled as compared to the enclosures in the prior art that use insulating assemblies. Accordingly, the system and method of the present disclosure are simpler to implement and are more efficient as compared to the systems and methods in the prior art.

More specifically, a dynamic coolant mixing manifold according to the present disclosure uses two three-way valves to mix hot and cold coolant to output the coolant at a desired coolant temperature and at a desired coolant flow rate. The two three-way valves use a bypass to return any unneeded/unused coolant to the coolant sources (called temperature control units (TCUs)) so that the TCUs may run at a constant flow rate. A third three-way valve divides the return flow received from the substrate support assembly between the two TCUs such that neither TCU is under- or overfilled.

A temperature sensor (e.g., a thermocouple (TC)) associated with (i.e., coupled to) a supply line supplying the mixed coolant from the two mixing three-way valves to the substrate support assembly senses the temperature of the coolant being supplied to the substrate support assembly. A flow meter associated with (i.e., coupled to) a return line returning the coolant from the substrate support assembly to the coolant sources via the third three-way valve measures the flow rate of the coolant flowing through the substrate support assembly. The two mixing valves utilize the thermocouple (TC) and the flow meter and proportional integral derivative (PID) control to regulate their position. The third return valve uses feedback from weight sensors on the TCU and PID control to regulate its position.

The proposed system utilizes only two three-way proportional valves to mix the hot and cold fluid to a desired temperature while maintaining a desired flow rate and to return unused fluid to the respective TCUs. An alternative scheme would require at least four two-way proportional valves to achieve the same result. Further, the third three-way proportional valve divides the fluid returned from the substrate support assembly such that neither TCU runs out of coolant or is overfilled with coolant. An alternative scheme would require at least two two-way proportional valves to achieve the same result. Accordingly, the proposed system uses fewer valves and is simple to implement.

Further, the proposed system utilizes a compact arrangement of valves and custom weldments to fit into a small space. The proposed system can also control the substrate temperature over a greater temperature range (−20° C. to 120° C.) by using a nitrogen purging/exhausting system as compared to the temperature range of 10° C. to 90° C. typically achievable using an insulated assembly instead.

The advantages of the proposed system over the prior art include fast temperature response time and low flow fluctuation. In addition, the TCUs can operate at a constant flow rate and output temperature, and the TCU tanks do not need to be rebalanced. Unlike in the prior art, by using the proposed system, the coolant temperature can be set in an analog fashion (i.e., in a continuous fashion) instead of in a digital fashion (i.e., in discrete steps). Further, by using the proposed system, any temperature can be selected between the hot and cold supply temperatures instead of choosing either a hot temperature or a cold temperature. This ability of the proposed system to select coolant temperature in a continuous fashion enhances the uniformity with which the substrate temperature can be controlled.

Figure 1:
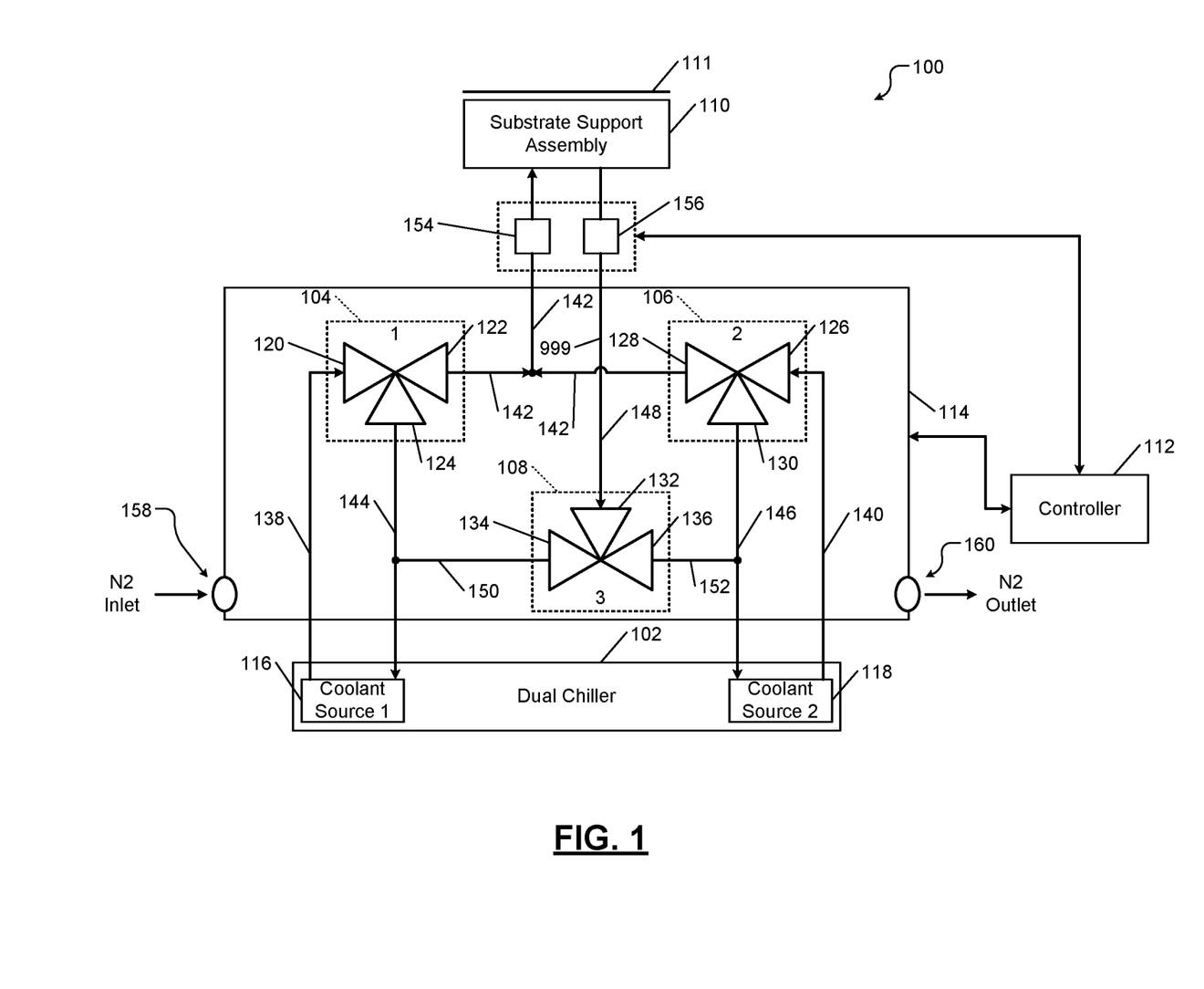
FIG. 1 shows a schematic of a system comprising three three-way proportional valves and a dual chiller to control a temperature of a substrate in a processing chamber.

FIG. 1 shows a system 100 for controlling the temperature of a substrate arranged on a substrate support assembly. The system 100 comprises a dual chiller 102, a first three-way proportional valve (hereinafter first valve) 104, a second three-way proportional valve (hereinafter second valve) 106, a third three-way proportional valve (hereinafter third valve) 108, a substrate support assembly 110, and a controller 112. The dual chiller 102, the first valve 104, the second valve 106, and the third valve 108 are enclosed in an enclosure 114. A substrate 111 may be arranged on the substrate support assembly 110 for processing in a processing chamber (not shown). The system 100 controls the temperature of the substrate 111 as follows.

The dual chiller 102 comprises a first coolant source 116 and a second coolant source 118. The first coolant source 116 supplies a coolant at a first temperature. The second coolant source 118 supplies the coolant at a second temperature. The first coolant source 116 and the second coolant source 118 supply the coolant at a fixed flow rate.

In some implementations, the first and second coolant sources 116, 118 may supply different coolants. In some implementations, the flow rate may need to be fixed for each of the first and second coolant sources 116, 118. In some implementations, the flow rates of the first and second coolant sources 116, 118 may be different although the flow rates may be fixed. For example, the first coolant source 116 may have a first fixed flow rate, and the second coolant source 118 may have a second fixed flow rate. In any of these implementations, the fixed flow rate or flow rates of the first and second coolant sources 116, 118 do not have to be varied and are not varied during operation to adjust the amount of coolant supplied by each of first and second coolant sources 116, 118.

The first valve 104 has an input port 120, a first output port 122, and a second output port (or bypass) 124. The second valve 106 has an input port 126, a first output port 128, and a second output port (or bypass) 130. The third valve 108 has an input port 132, a first output port 134, and a second output port 136.

The input port 120 of the first valve 104 receives the coolant at the first temperature from the first coolant source 116 at the fixed flow rate via a first fluid line 138. The input port 126 of the second valve 106 receives the coolant at the second temperature from the second coolant source 118 at the fixed flow rate via a second fluid line 140.

The first output port 122 of the first valve 104 outputs a first portion of the coolant received from the first coolant source 116 into a supply line 142. The first output port 128 of the second valve 106 outputs a first portion of the coolant received from the second coolant source 118 into the supply line 142. The first portions of the coolant output from the respective first output ports 122, 128 of the first and second valves 104, 106 are mixed in the supply line 142.

The mixed coolant in the supply line 142 is supplied to the substrate support assembly 110. The mixed coolant may be supplied to one or more flow passages (not shown) arranged in the substrate support assembly 110 to control the temperature of the substrate 111 arranged on the substrate support assembly 110.

The controller 112 controls the first and second valves 104, 106 and determines the amounts of the first portions of the coolant that are output from the respective first output ports 122, 128 of the first and second valves 104, 106. The controller 112 controls the first and second valves 104, 106 and determines the amounts based on a desired temperature (e.g., a predetermined temperature) at which the coolant is to be supplied via the supply line 142 to the substrate support assembly 110 to control substrate temperature. The first portions of the coolant that are output from the respective first output ports 122, 128 of the first and second valves 104, 106 are mixed in the supply line 142, and the resulting mixed coolant having the desired temperature is supplied via the supply line 142 to the substrate support assembly 110 at a desired flow rate (e.g., a predetermined flow rate).

A second portion of the coolant received by the first valve 104 from the first coolant source 116 may not be needed to mix with the first portion of the coolant received by the second valve 106 from the second coolant source 118 to supply the coolant at the desired temperature and at the desired flow rate to the substrate support assembly 110. The second portion of the coolant received by the first valve 104 from the first coolant source 116 that is not output from the first output port 122 of the first valve 104 into the supply line 142 is returned to the first coolant source 116 via the second output port (or bypass) 124 of the first valve 104 and via a fluid line 144.

A second portion of the coolant received by the second valve 106 from the second coolant source 118 may not be needed to mix with the first portion of the coolant received by the first valve 104 from the first coolant source 116 to supply the coolant at the desired temperature and at the desired flow rate to the substrate support assembly 110. The second portion of the coolant received by the second valve 106 from the second coolant source 118 that is not output from the first output port 128 of the second valve 106 into the supply line 142 is returned to the second coolant source 118 via the second output port (or bypass) 130 of the second valve 106 and via a fluid line 146.

Since the unused portions (i.e. the second portions) of the coolant received by the first and second valves 104, 106 are returned to the first and second coolant sources 116, 118, the first and second coolant sources 116, 118 can supply the coolant to the first and second valves 104, 106 at a fixed flow rate. This simplifies the design of the dual chiller 102. For example, a pump (not shown) used to pump the coolant from the first and second coolant sources 116, 118 to the first and second valves 104, 106 can be operated at a single speed. Further, the first and second temperatures of the coolant in the first and second coolant sources 116, 118 can be easily maintained.

The coolant returned from the substrate support assembly 110 is received by the third valve 108 via a return line 148. The input port 132 of the third valve 108 receives the coolant from the substrate support assembly 110 via the return line 148. The third valve 108 divides the returned coolant between the first and second sources 116, 118. A first portion of the coolant received by the third valve 108 from the substrate support assembly 110 is returned to the first coolant source 116 via the first output port 134 of the third valve 108 through a fluid line 150 and the fluid line 144. A second portion of the coolant received by the third valve 108 from the substrate support assembly 110 is returned to the second coolant source 118 via the second output port 136 of the third valve 108 through a fluid line 152 and the fluid line 146.

The controller 112 controls the third valve 108 and determines the appropriate or desired amounts of the first and second portions of the coolant that are output from the first and second output ports 134, 136 of the third valve 108 to the first and second coolant sources 116, 118, respectively. For example, the controller 112 monitors the weight of the coolant in the first and second coolant sources 116, 118 based on data received from weight sensors (not shown) in the first and second coolant sources 116, 118. Accordingly, the controller 112 determines the level of the coolant in each of the first and second coolant sources 116, 118 and determines the amounts of the first and second portions of the coolant to return to the first and second coolant sources 116, 118.

It is desirable to have sufficient coolant in each of the first and second coolant sources 116, 118. For example, it may be desirable that the amount of coolant in each of the first and second coolant sources 116, 118 is not less than or equal to a first threshold and not greater than or equal to a second threshold. The first threshold may be a minimum allowable low level of coolant to prevent an under-filled condition in each of the first and second coolant sources 116, 118. The second threshold may be a maximum allowable high level of coolant to prevent an overfilled condition in each of the first and second coolant sources 116, 118.

Accordingly, the controller 112 controls the first and second output ports 134, 136 of the third valve 108 such that the first and second portions of the coolant that are output from the first and second output ports 134, 136 to the first and second coolant sources 116, 118 maintain the coolant level accordingly in each of the first and second coolant sources 116, 118 between the first and second thresholds. For example, the controller 112 controls the first and second output ports 134, 136 of the third valve 108 and determines the first and second portions of the coolant to output from the first and second output ports 134, 136 to the first and second coolant sources 116, 118 based on feedback from the weight sensors regarding the weight of the coolant in each of the first and second coolant sources 116, 118 so as to maintain the coolant level in each of the first and second coolant sources 116, 118 between the first and second thresholds. Thus, the controller 112 controls (i.e., regulates the position of) the third valve 108 based on data received from weight sensors in the first and second coolant sources 116, 118 in order to prevent an under- and overfilled conditions from occurring in each of the first and second coolant sources 116, 118.

The system 100 further comprises a temperature sensor (e.g., a thermocouple) 154 and a flow meter 156. The temperature sensor 154 is associated with (i.e., coupled to) the supply line 142. The flow meter 156 is associated with (i.e., coupled to) the return line 148. The temperature sensor 154 senses the temperature of the coolant supplied to the substrate support assembly 110 through the supply line 142. The flow meter 156 measures the flow rate of the coolant returned from the substrate support assembly 110 through the return line 148.

The controller 112 comprises a proportional integral derivative (PID) controller. The controller 112 controls the amount of coolant supplied by the first and second valves 104, 106 based on the desired temperature at which the coolant is to be supplied to the substrate support assembly 110 and the temperature of the coolant sensed by the temperature sensor 154. Accordingly, the controller 112 controls the respective first output ports 122, 128 of the first and second valves 104, 106 based on the desired temperature at which the coolant is to be supplied to the substrate support assembly 110 and the temperature of the coolant sensed by the temperature sensor 154.

Additionally, the controller 112 controls the amount of coolant supplied by the first and second valves 104, 106 based on the desired flow rate at which the coolant is to be supplied to the substrate support assembly 110 and the flow rate of the coolant sensed by the flow meter 156. Accordingly, the controller 112 controls the respective first output ports 122, 128 of the first and second valves 104, 106 based on the desired flow rate at which the coolant is to be supplied to the substrate support assembly 110 and the flow rate of the coolant measured by the flow meter 156. Thus, the controller 112 controls (i.e., regulates the position of) the first and second valves 104, 106 based on data received from the temperature sensor 154 and the flow meter 156.

The enclosure 114 has an inlet 158 and an outlet 160. Nitrogen is passed into the enclosure 114 through the inlet 158 and out of the enclosure 114 through the outlet 160. The nitrogen displaces any humid air that may be present in the enclosure 114. The use of nitrogen improves the temperature control of the dual chiller 102 and increases the temperature range over which the temperature of the substrate 111 can be controlled using the system 100 (e.g., from −20° C. to 120° C.).

Figure 2:
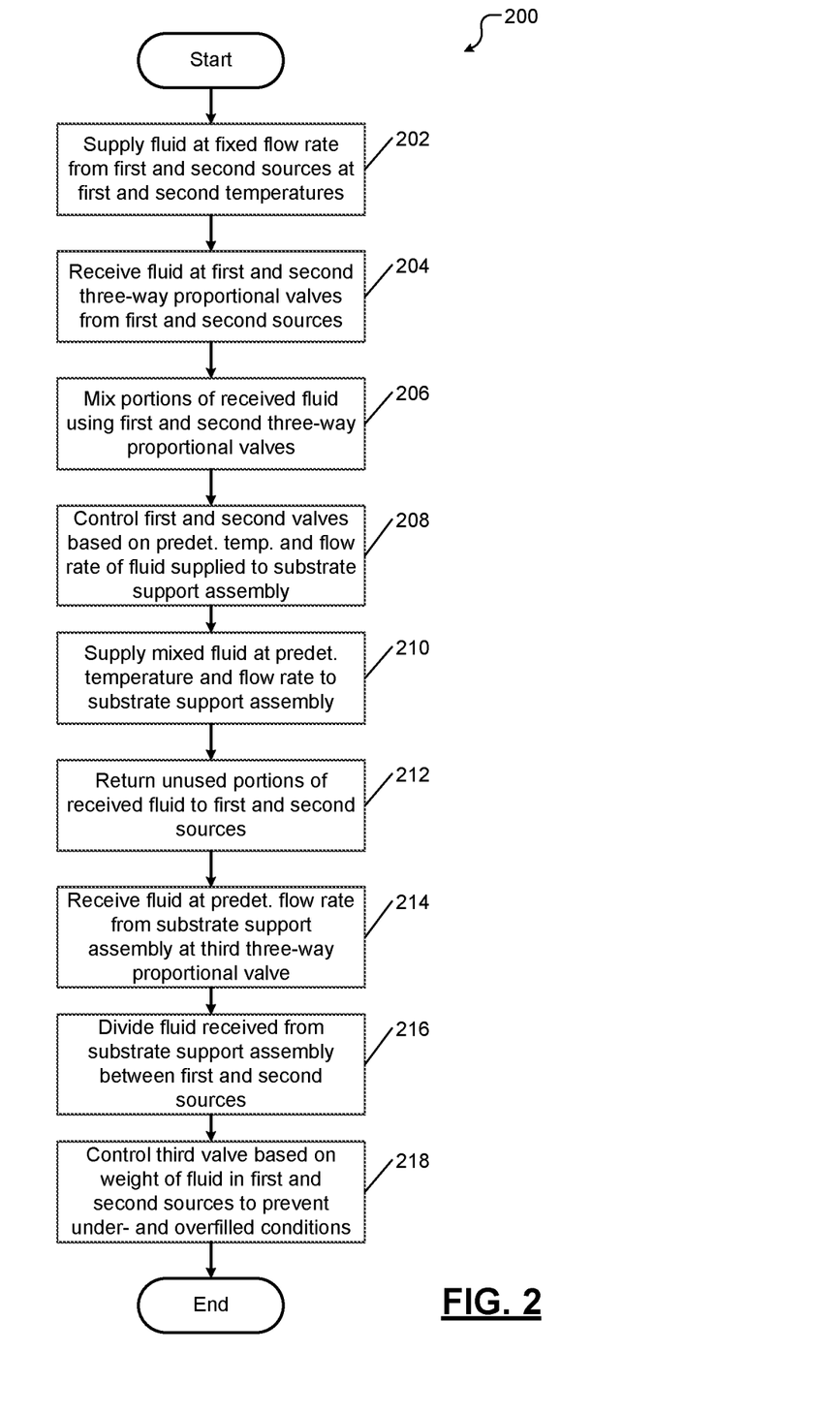
FIG. 2 shows a flowchart of a method for controlling a temperature of a substrate in a processing chamber using three three-way proportional valves and a dual chiller.

FIG. 2 shows a method 200 for controlling the temperature of a substrate arranged on a substrate support assembly. For example, the method 200 is performed by the controller 112 shown in FIG. 1. At 202, a fluid (e.g., coolant) is supplied at a fixed flow rate from first and second fluid sources (e.g., the first and second coolant sources 116, 118 shown in FIG. 1) at first and second temperatures, respectively. At 204, the fluid supplied at first and second temperatures by the first and second fluid sources is received at first and second valves (e.g., the first and second valves 104, 106 shown in FIG. 1), respectively.

At 206, portions of the received fluid are mixed using the first and second valves. At 208, the amounts of the fluid received from the first and second fluid sources that are mixed are determined by controlling the first and second valves based on the desired temperature and flow rate at which the fluid is to be supplied to the substrate support assembly to control the temperature of the substrate.

At 210, the mixed fluid at the desired temperature is supplied at the desired flow rate to the substrate support assembly (e.g., the substrate support assembly 110 shown in FIG. 1) for controlling temperature of the substrate (e.g., the substrate 111 shown in FIG. 1). At 212, unused portions of the fluids received from the first and second sources are returned to the first and second fluid sources using the first and second valves, respectively.

At 214, the fluid returned from the substrate support assembly is received at a third valve (e.g., the third valve 108 shown in FIG. 1). At 214, the fluid received from the substrate support assembly is divided between the first and second fluid sources. At 216, the amounts of the fluid received from the substrate support assembly that are returned to the first and second fluid sources are determined by controlling the third valve based on feedback from the weight sensors regarding the weight of the fluid present in the first and second fluid sources, respectively. The amounts of the fluid received from the substrate support assembly are divided and returned to the first and second fluid sources by controlling the third valve so that the fluid level in each of the first and second fluid sources is maintained between a low and a high level threshold. This prevents under- and overfilled conditions from occurring in each of the first and second fluid sources.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. A system for controlling temperature of a substrate arranged on a substrate support assembly, the system comprising:
    first and second sources to respectively supply a fluid at first and second temperatures;
    a first three-way proportional valve with an input port connected to the first source, a first output port connected to a supply line to supply the fluid from the first source to the substrate support assembly, and a second output port connected to the first source;
    a second three-way proportional valve with an input port connected to the second source, a first output port connected to the supply line to supply the fluid from the second source to the substrate support assembly, and a second output port connected to the second source;
    a third three-way proportional valve with an input port connected to a return line to receive the fluid from the substrate support assembly, and first and second output ports respectively connected to the first and second sources to return the fluid received from the substrate support assembly to the first and second sources; and
    a controller configured to control the first and second three-way proportional valves to:
        output first portions of the fluid received from the first and second sources via the respective input ports to supply the fluid to the substrate support assembly via the supply line at a predetermined temperature and at a predetermined flow rate; and
        return second portions of the fluid received from the first and second sources via the respective input ports to the first and second sources via the second output ports of the first and second three-way proportional valves, respectively; and
    wherein the controller is further configured to control the third three-way proportional valve to divide the fluid received from the substrate support assembly via the return line between the first and second sources to maintain fluid levels of the first and second sources between first and second thresholds,
    wherein the first threshold is a minimum allowable level of the fluid to prevent an under-filled condition in each of the first and second sources, and wherein the second threshold is a maximum allowable level of the fluid to prevent an overfilled condition in each of the first and second sources.

2. The system of claim 1 wherein the controller is further configured to control a temperature of the substrate based on the fluid supplied to the substrate support assembly via the supply line at the predetermined temperature and at the predetermined flow rate.

3. The system of claim 1 wherein the first and second sources supply the fluid to the first and second three-way proportional valves at a fixed flow rate.

4. The system of claim 1 further comprising:
    a temperature sensor associated with the supply line; and
    a flow meter associated with the return line,
    wherein the controller is further configured to control the first and second three-way proportional valves based on data received from the temperature sensor and the flow meter.

5. The system of claim 1 further comprising an enclosure to enclose the first, second, and third three-way proportional valves, and fluid lines connecting the first and second sources to the first, second, and third three-way proportional valves, wherein the enclosure comprises an inlet and an outlet, and wherein nitrogen is passed through the enclosure via the inlet and the outlet to displace humid air from the enclosure.

6. A system for controlling temperature of a substrate arranged on a substrate support assembly, the system comprising:
    first and second sources to respectively supply a fluid at first and second temperatures at a fixed flow rate;
    first and second three-way proportional valves to receive the fluid from the first and second sources at the first and second temperatures at the fixed flow rate, to mix first portions of the received fluid to supply the fluid having a predetermined temperature to the substrate support assembly at a predetermined flow rate, and to return second portions of the received fluid to the first and second sources;
    a third three-way proportional valve to receive the fluid from the substrate support assembly and to return the fluid received from the substrate support assembly to the first and second sources; and
    a controller configured to control the first and second three-way proportional valves to supply the fluid having the predetermined temperature to the substrate support assembly at the predetermined flow rate; and
    wherein the controller is further configured to control the third three-way proportional valve to divide the fluid received from the substrate support assembly between the first and second sources to maintain fluid levels of the first and second sources between first and second thresholds, wherein the first threshold is a minimum allowable level of the fluid to prevent an under-filled condition in each of the first and second sources, and wherein the second threshold is a maximum allowable level of the fluid to prevent an overfilled condition in each of the first and second sources.

7. The system of claim 6 wherein the controller is further configured to control a temperature of the substrate based on the fluid supplied to the substrate support assembly at the predetermined temperature and at the predetermined flow rate.

8. The system of claim 6 further comprising:
a temperature sensor associated with a supply line that supplies the fluid from the first and second three-way proportional valves to the substrate support assembly; and
a flow meter associated with a return line that returns the fluid from the substrate support assembly to the third three-way proportional valve,
wherein the controller is further configured to control the first and second three-way proportional valves based on data received from the temperature sensor and the flow meter.

9. The system of claim 6 further comprising an enclosure to enclose the first, second, and third three-way proportional valves, and fluid lines connecting the first and second sources to the first, second, and third three-way proportional valves, wherein the enclosure comprises an inlet and an outlet, and wherein nitrogen is passed through the enclosure via the inlet and the outlet to displace humid air from the enclosure.

10. A method for controlling temperature of a substrate arranged on a substrate support assembly, the method comprising:
receiving, at first and second three-way proportional valves, a fluid having first and second temperatures at a fixed flow rate from first and second sources, respectively;
mixing, using the first and second three-way proportional valves, portions of the fluid received from the first and second sources, the mixed portions of the fluid having a predetermined temperature;
returning, using the first and second three-way proportional valves, unused portions of the fluid received from the first and second sources to the first and second sources, respectively;
supplying the mixed portions of the fluid having the predetermined temperature to the substrate support assembly at a predetermined flow rate;
receiving the mixed portions of the fluid from the substrate support assembly at a third three-way proportional valve;
returning, using the third three-way proportional valve, the mixed portions of the fluid received from the substrate support assembly to the first and second sources;
controlling the first and second three-way proportional valves to supply the mixed portions of the fluid having the predetermined temperature to the substrate support assembly at the predetermined flow rate; and
controlling the third three-way proportional valve to divide the mixed portions of the fluid received from the substrate support assembly between the first and second sources to maintain fluid levels of the first and second sources between first and second thresholds, wherein the first threshold is a minimum allowable level of the fluid to prevent an under-filled condition in each of the first and second sources, and wherein the second threshold is a maximum allowable level of the fluid to prevent an overfilled condition in each of the first and second sources.

11. The method of claim 10 further comprising controlling a temperature of the substrate based on the fluid supplied to the substrate support assembly at the predetermined temperature and at the predetermined flow rate.

12. The method of claim 10 further comprising:
sensing a temperature of the mixed portions of the fluid being supplied from the first and second three-way proportional valves to the substrate support assembly;
measuring a flow rate of the mixed portions of the fluid flowing from the substrate support assembly to the third three-way proportional valve; and
controlling the first and second three-way proportional valves based on the temperature and the flow rate.

13. The method of claim 10 further comprising:
enclosing, in an enclosure, the first, second, and third three-way proportional valves, and fluid lines connecting the first and second sources to the first, second, and third three-way proportional valves; and
passing nitrogen through the enclosure to displace humid air from the enclosure.

* * * * *